United States Patent [19]

Thijs et al.

[11] Patent Number: 5,151,818
[45] Date of Patent: Sep. 29, 1992

[54] SEMICONDUCTOR OPTICAL AMPLIFIER

[75] Inventors: Petrus J. A. Thijs; Lukas F. Tiemeijer, both of Eindhoven, Netherlands

[73] Assignee: U. S. Philips Corp., New York, N.Y.

[21] Appl. No.: 738,062

[22] Filed: Jul. 30, 1991

[30] Foreign Application Priority Data

Aug. 3, 1990 [NL] Netherlands .................. 9001761

[51] Int. Cl.$^5$ .................. H01S 3/25; H01S 3/19; C02F 3/00
[52] U.S. Cl. .................. 359/344; 357/30; 372/45
[58] Field of Search .................. 359/344; 357/17, 30; 372/14, 33, 45

[56] References Cited

U.S. PATENT DOCUMENTS

| | | | |
|---|---|---|---|
| 4,612,645 | 9/1986 | Liu | 357/17 |
| 4,663,761 | 5/1987 | Barnard et al. | 372/45 |
| 4,685,108 | 8/1987 | Seymour et al. | 372/19 |
| 4,804,639 | 4/1989 | Yablonovitch | 372/45 |
| 4,935,935 | 6/1990 | Reed et al. | 372/44 |
| 4,952,792 | 8/1990 | Caridi | 357/30 |
| 5,011,550 | 4/1991 | Konushi et al. | 437/132 |

OTHER PUBLICATIONS

Melman et al.; "In GaAs/GaAs Strained Quantum Wells..."Appl. Phys. Lett., vol. 55, No. 14, pp. 1436-8 Oct. 28, 1989; abst. only provided.
Schblerkamp et al.; "Quantum-Well Starts . . . Tension"; Phys. Rev. B. Covelens. Matter, Vol. 40, #5, pp. 3077-80 Aug. 15, 1989, abst. only.
M. Houng; "the Strain Effect on . . . Quantum Wells"; 1989, Superlatices Microstruct., vol. 6, #4, pp. 421-6; abst. only.
Mailhiat et al.; "Effects of Compressive Uniaxial Stress . . . "; Phys. Rev. B., vol. 36, #5, pp. 2942-5, Aug. 15, 1987. abst. only.

Primary Examiner—Nelson Moskowitz
Attorney, Agent, or Firm—Steven R. Biren

[57] ABSTRACT

An optical amplifier with a semiconductor body includes a layer structure grown on a substrate, with an active layer between two cladding layers, and a strip-shaped amplification region bounded by two end faces of low reflection which form the input and output faces for the radiation to be amplified. The active layer has a number of quantum well (QW) layers with direct band transition, and separated by barrier layers of a different semiconductor material, a first portion of the QW layers being under tensile stress. Another portion of the layers forming part of the active layer is under compressive stress. Owing to the compressive stress present locally in the amplification region, the TE-mode is more strongly amplified there than the TM-mode, while in the tensile portion of the amplification region the TM-mode is more strongly amplified than the TE-mode. This results in a polarization-insensitive amplifier with higher stress and thus with a large amplification at a relatively low current. In one embodiment, both portions of QW layers are within one stack of layers containing the amplification region. In another embodiment both portions are positioned in different stacks that are located next to each other each adjoining a different end zone of the amplification region. In the latter, independent adjustment of the TE and TM amplification profiles is possible.

9 Claims, 4 Drawing Sheets

SEMICONDUCTOR OPTICAL AMPLIFIER

BACKGROUND OF THE INVENTION

The invention relates to an optical amplifier having at least a semiconductor body comprising a substrate of a first conductivity type and at least a semiconductor layer structure situated thereon consisting of at least a first passive layer of the first conductivity type, a second passive layer of the second, opposite conductivity type, and between the first and the second passive layer an active layer and a pn junction, amplification of electromagnetic radiation within a wavelength range taking place at a sufficiently high current strength in the forward direction through the pn junction within a strip-shaped amplification region of the active layer, which has a greater effective refractive index and a smaller bandgap for the radiation to be amplified than the first and second passive layers, which comprises a plurality of quantum well layers (QW layers for short) of a semiconductor material having a direct band transition and mutually separated by barrier layers of a different semiconductor material, and in which a portion of the (QW and barrier) layers which form part of the active layer, to be called first portion hereinafter, are under tensile stress, while the strip-shaped amplification region is bounded in longitudinal direction by end faces which serve as input and output surfaces for the radiation to be amplified and which are of low reflection, the second passive layer and the substrate being electrically connected to connection conductors.

Such optical amplifiers are frequently used in optical communication technology. Large distances must often be bridged and/or strongly branched-out networks must be used in optical telecommunication systems such as optical glass fiber systems. Often a weak or attenuated optical signal must then be regenerated once or several times in its path by an optical amplifier. Amplification of radiation takes place in the active layer in such an amplifier. This amplification has its maximum at a wavelength which depends on, among other factors, the choice of the semiconductor material of the active layer, the thickness of the QW layers, and the Fabry-Pérot (FP) resonances, which in their turn are determined by the positions of the end faces. Because the end faces have low reflection, for example owing to the fact that they are coated with an anti-reflection layer, an optical amplifier of the travelling-wave type is obtained with a comparatively wide-band amplification profile which is determined by material amplification only. The use of an MQW active layer further has major advantages, such as a much higher saturation power, greater amplification bandwidth, an improved noise number, and a higher saturation gain.

Such an optical amplifier is known from the Japanese Patent Application JP-A-01/251685 (date of publication Jun. 10, 1989) which was laid open to public inspection and published in Patent Abstracts of Japan, vol. 14, Jan. 8, 1990, no. 2 (E-868), p. 72. The known optical amplifier is manufactured in the GaAs/InAlGaAs material system, employing a Multi Quantum Well (MQW) active layer in which the QW layers are under tensile stress. Due to the tensile stress, the amplification profile of TM-polarized radiation, which has its peak value at a different wavelength than the amplification profile of TE-polarized radiation, is raised at the detriment of the level of the amplification profile of TE-polarized radiation. For a (lattice matched) MQW active layer, the amplification profile of TE-polarized radiation is higher than that of TM-polarized radiation. Thus, introduction of tensile stress reduces the sensitivity to the polarization of the incoming radiation. At a certain point, i.e. at a tensile stress of about 0,6% (in this specification, a comma is used to denote a decimal point), both amplification profiles will be almost equally high. For the wavelength at the point of intersection of the two profiles, the amplifier will be insensitive to the polarization of the incoming radiation, while the amplification is near its peak value, i.e. near the peak value of both profiles. The rise of the amplification profile for TM-polarized radiation is connected with the influence of mechanical stress on the positions of the energy levels of the light holes (LH) and heavy holes (HH) in the valency band of the semiconductor material of the layers forming part of the active layer: tensile stress results in that the level of the light holes comes closer to that of the heavy holes, so that the TM-mode is less at a disadvantage.

A disadvantage of the known optical amplifier is that the amplification at the point of intersection is obtained at a relatively high current. The corresponding relatively high dissipation limits the lifetime and thus the performance of the known amplifier at the wavelength where it is insensitive to polarization.

SUMMARY OF THE INVENTION

The present invention has for its object inter alia to provide an optical amplifier which is insensitive to the polarization of the incoming radiation, which has a high amplification at a low current, and which is easy to manufacture.

The invention is based inter alia on the recognition that the current required to obtain amplification can be influenced by means of mechanical stress present in the active layer.

Therefore, an optical amplifier of the kind mentioned above is characterized in that another portion, to be called second portion hereinafter, of the (QW and barrier) layers which form part of the active layer are under compressive stress. It has been found that the current required to obtain the amplification at the point of intersection can be decreased by increasing the tensile stress present. However, an increase of the tensile stress further than the above-mentioned value will raise the amplification profile of TM-polarized radiation to the detriment of the level of the amplification profile of TE-polarized radiation. Thus, such an increase will detract from the polarization insensitivity. The compressive stress, according to the invention present in the second portion, achieves that in the relevant portion of the amplification region the amplification profile for TE-polarized radiation is founded to the detriment of the amplification profile of the TM-polarized radiation, while amplification is also obtained at a lower current compared with the situation without stress. Thus, the amplification profile of the TM-polarized radiation can be further raised by further increasing the tensile stress in the first portion before both amplification profiles are at about the same level. Thus in an amplifier according to the invention, the amplification at the point of intersection, where the amplifier is insensitive to the polarization of the incoming radiation, is also increased and the same amplification can be obtained with a lower current. In this way the lifetime and thus the performance of the amplifier according to the invention is improved.

In a first embodiment, both the tensile and the compressive stress are so high that the peak value of the amplification profile of TM-polarized radiation is about equal to the peak value of the amplification profile of TE-polarized radiation. In this embodiment, the amplification of the crossing point of both amplification profiles is close to both the peak values of the amplification profiles of TE- and TM-polarized radiation. Thus, in the point of intersection polarization insensitivity is combined with a high amplification at a low current. The desired tensile and compressive stresses in the first and second portions may be obtained by introducing the desired stress into a barrier layer, but preferably the QW layers of the first and second portion are provided with tensile and compressive stresses. This can be realized by introducing a stress of the opposite sign into a layer that is close to the relevant section. Preferably, the tensile stress in the first portion is realized in that a semiconductor material is chosen for the QW layers which has a smaller lattice constant than that of the substrate. This can be simply done by taking a suitable composition, especially in the case of ternary or quaternary semiconductor materials. The same holds for the compressive stress in the second portion which is obtained by choosing a material for the semiconductor material of the QW layers which has a larger lattice constant than that of the substrate. The extent of the stress resulting from a certain deviation of the lattice constant (of the QW layers relative to the substrate) further depends on the number of QW layers and their thickness, as well as on the thickness and the lattice constant of the barrier layers. In a preferred embodiment, the portions of QW layers with tensile and compressive stress are realized within one stack of QW layers, in which there are provided alternatively a QW layer with a tensile stress and a QW layer with a compressive stress and a lattice matched barrier layer between each two QW layers. This embodiment is very easy to make, which is a larger advantage. Another favorable embodiment is obtained if both portions lie within a separate stack of QW and barrier layers, which stacks are located within portions of the amplification region which adjoin different faces. This has the further advantage that the amplification within both portions can be adjusted independently as both portions can be provided with a separate current source. Preferably, the amplifier according to the invention is realized in the InP/InGaAs/InGaAsP material system that corresponds with the wavelength region of 1,3 to 1,5 μm. An optical amplifier according to the invention and realized in the InP/InGaAsP material system comprises, for example, an InP substrate with, between two passive InP layers and between two separate cladding layers of InGaAsP, a first portion of six QW layers of InGaAs under tensile stress and with a thickness of about 10 nm, which are separated from a neighboring QW layer by means of an InGaAsP barrier layer with an indium content of 82 at % and an arsenic content of 40 at %, and with a thickness of preferably at least 5 nm, for example, approximately 10 nm. The amplifier contains likewise a second portion of six QW layers under compressive stress and with a thickness of about 3 nm. The first and second portions may be positioned interleaved or separate, within a single stack of QW and barrier layers or may be positioned in different stacks that are located next to each other. A suitable tensile stress in the first portion with InGaAs QW layers is achieved approximately at a relative deviation in lattice constant compared with the substrate of InP of approximately 1 to 1,5%. This deviation is realized by choosing an indium content of approximately 35 at % instead of approximately 53 at %, at which latter figure the lattice constant of InGaAs is equal to that of InP. A suitable compressive stress in the second portion also containing InGaAs QW layers but with a thickness of 3 nm is achieved approximately at a relative deviation in lattice constant compared with the substrate of InP of approximately $-1$ to $-1,5\%$, which is realized by choosing an indium content of approximately 70 at %. The difference in thickness of the QW layers has for its object inter alia to compensate for the change in bandgap of in this case InGaAs as a result of the change in composition: more indium decreases the bandgap, a smaller thickness of the QW layer increases the bandgap again. It is achieved in this way that the wavelength at which the amplification is at a maximum for both portions of the amplification region is as much as possible the same. For the present example, this wavelength is approximately 1,5 μm. Both variants of amplifiers according to the invention, are not or substantially not sensitive to polarization and have a high amplification at a low current strength. When the portions with tensile and compressive stress are placed next to one another, they are preferably positioned in two portions of the amplification region which each adjoin an end face. The portions may be laterally interconnected either directly or at least substantially directly, or via a radiation-guiding intermediate layer, so that the radiation incident on the amplifier is efficiently guided from the mainly TE-amplifying portion of the amplification region to the mainly TM-amplifying portion of the amplification region. Both portions of the amplification region in that case have separate current supplies which comprise connection conductors provided on portions of the second passive layer which are situated above the portions under tensile and compressive stress. The connection conductor on the substrate is common to both portions. If a contact layer is used between the connection conductors and the second passive layer, this contact layer comprises a groove which promotes the current separation at the area of the transition between the two portions. In a modification, the groove extends from the surface to beyond the active layer. Means may then be provided in the groove for an efficient optical coupling between the portions of the active layer having tensile stress and compressive stress, respectively. In a further modification, the groove extends to beyond the substrate, and the amplifier essentially comprises two separate sub-amplifiers for the TE and the TM-modes, each comprising a separate portion of the semiconductor body.

It should be noted that the number of QW layers and the mismatch of these layers at the upper side are limited by the occurrence of relaxation of the resulting stress, (undesirable) defects and dislocations then occurring. According to a rule of thumb which is of practical use, the product of the thickness and the deviation of the lattice constant of a layer relative to the substrate must be smaller than approximately 20 nm* %. The minimum required deviation of the lattice constant relative to the substrate is approximately 0,6%. Accordingly, the thickness of such a (quantum well) layer is preferably smaller than approximately 30 nm or 300 Å. The total thickness of MQW layers which is still of practical use in the case of an MQW active layer, is limited in a similar manner.

BRIEF DESCRIPTION OF THE DRAWING

The invention will now be explained in more detail with reference to two embodiments and the accompanying drawing, in which.

The Figures are diagrammatic and not drawn to scale, in particular the dimensions in the thickness direction being strongly exaggerated for greater clarity. Corresponding parts are usually given the same reference numerals in the various Figures.

DESCRIPTION OF THE PREFERRED EMBODIMENTS

Figure 1:
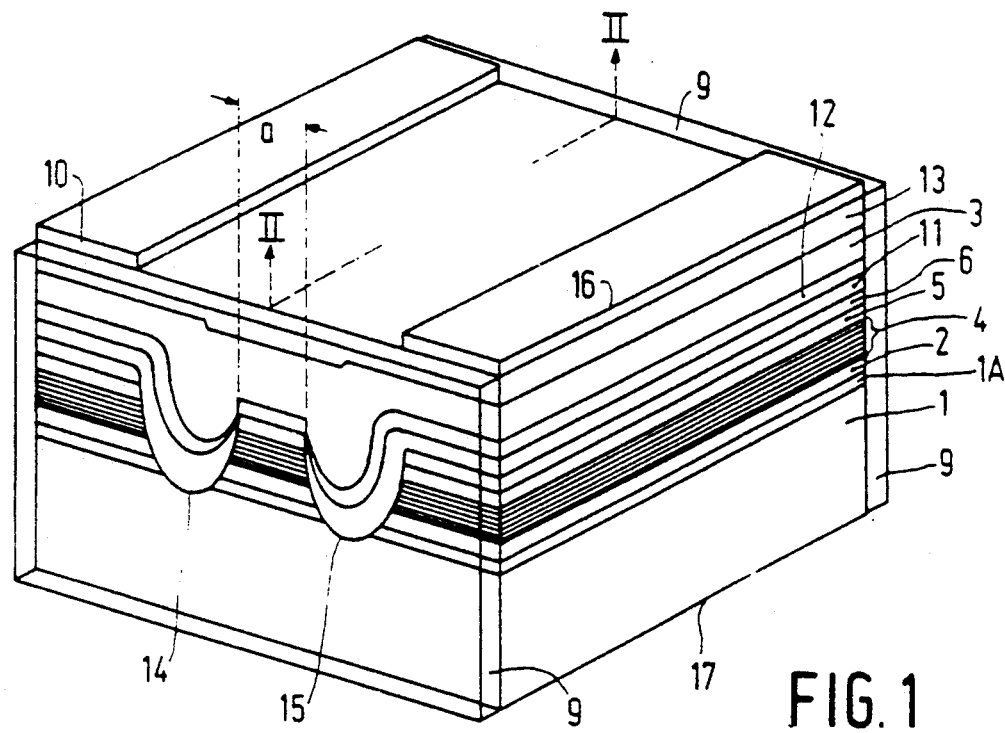
FIG. 1 diagrammatically shows a first embodiment of an optical amplifier according to the invention, partly in perspective and partly in cross-section, FIG. 2 diagrammatically shows a cross-section taken on the line II—II of FIG. 1.
Figure 2:
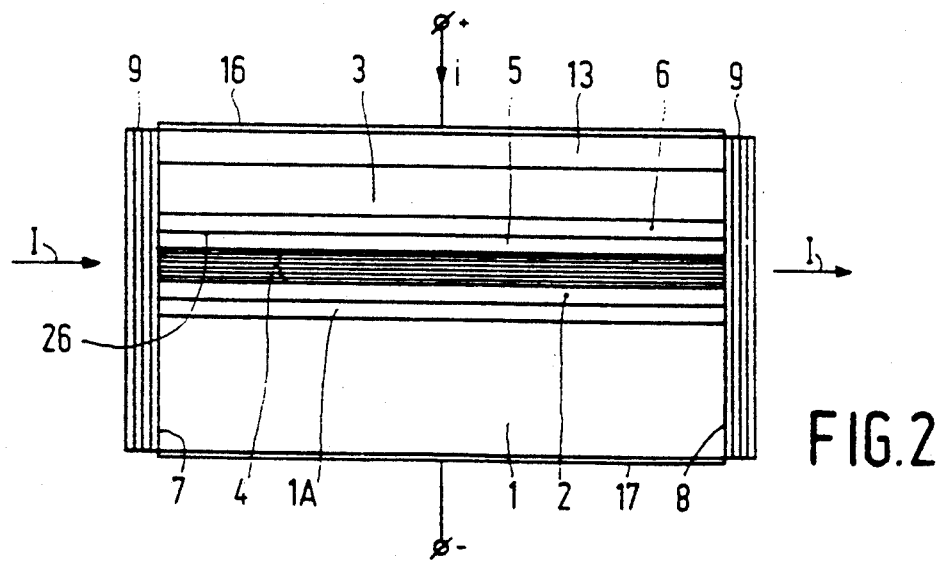

FIG. 1 diagrammatically shows partly in perspective and partly in cross-section an optical amplifier according to the invention and in a first embodiment, while FIG. 2 diagrammatically shows a cross-section taken on the line II—II of FIG. 1 of the optical amplifier of FIG. 1. The device has a semiconductor body comprising a substrate 1 of a first, here the n-conductivity type and made of InP (doping, for example, $5 \times 10^{18}$ at/cm$^3$) and a layer structure thereon. This layer structure comprises an n-type buffer layer 1A which forms a first passive layer, a first separate cladding layer 2 of the said first, in this case n-conductivity type and made of $In_{x}Ga_{1-x}As_yP_{1-y}$ (x=0,82 and y=0,40), a second separate cladding layer 5 having the same properties as the first separate cladding layer 2, a second passive layer 3, 6 of the second, opposite conductivity type, so here the p-type, and made of InP, a contact layer 13 of the second, so here the p-conductivity type and made of $In_{x}Ga_{1-x}As_yP_{1-y}$ (x=0,73 and y=0,60), and between the passive layers 1A and 3, 6 an active layer 4, which in this example is situated between the separate cladding layers 2 and 5. The active layer 4 (see also the detailed cross-section of FIG. 3) comprises a plurality, in this example twelve quantum well layers, a first portion of which (QW) layers are under tensile stress and comprises six QW layers 4A of a semiconductor material with a direct band transition, in this example of $In_{x}Ga_{1-x}As$ (x=0,35) and having a thickness of about 10 nm, which are mutually separated by barrier layers 4C of a different semiconductor material, in this example $In_xGa_{1-x}As_yP_{1-y}$ (x=0,82 and y=0,40) and with a thickness of approximately 10 nm. The thickness of the passive layers 1A and 3, 6 is approximately 1 μm and their doping concentration is approximately from $5 \times 10^{17}$ to $1 \times 10^{18}$ at/cm$^3$. The separate cladding layers 2 and 5 are approximately 80 nm thick and are not purposely doped, which implies that they are faintly n-type. The latter is also true for the QW layers 4A and the barrier layers 4C. The layers 2, 5 and 4C which are not purposely doped, however, are also allowed to have an n-type doping. The contact layer 13 is approximately 0,5 μm thick and has a doping concentration of approximately $10^{19}$ at/cm$^3$. Furthermore, the said layer structure comprises a pn-junction 26 between the passive layers 2 and 3, 6, which in this example adjoins the p-type layer 3. Provided there is a sufficiently strong current (i) in the forward direction through the pn-junction 26, amplification of electromagnetic radiation (I) takes place within a strip-shaped amplification region of the active layer 4 for certain wavelengths. The active layer 4 here has a greater effective refractive index for the radiation I to be amplified and a smaller bandgap than do the first 1A and second 3, 6 passive layers. The strip-shaped amplification region, whose width is diagrammatically indicated in FIG. 1 with a, is bounded by end faces 7 and 8 of low reflection which are practically perpendicular to the active layer 4 and which serve as input and output faces for the radiation I to be amplified, which end faces have a low reflection in this example thanks to the presence of anti-reflection layers 9 which have a reflection coefficient for the relevant wavelength area of at most approximately 1%, and preferably smaller than 0,1%. The second passive layer 3 and the substrate 1 are electrically connected to connection conductors in the shape of metal layers 16 and 17 through which a current i can be supplied to the pn-junction 6 in the forward direction.

According to the invention, another, second, portion of the (QW and barrier) layers forming part of the active layer, in this example all QW layers 4B, are under compressive stress. Due to the presence of the layers 4A and 4B, the polarization sensitivity of the amplifier according to the invention is reduced, while the current required to obtain a suitable amplification is reduced. In this example, this is realized in that a semiconductor material is taken for the QW layers 4B, in this example $In_xGa_{1-x}As$ (x=0,70), whose lattice constant is larger than the lattice constant of the substrate, in this example InP. Both the tensile and the compressive stress in the first and second portion respectively, are in this example so high that the peak value of the amplification profile of the TM-polarized radiation is about equal to the peak value of the amplification profile of the TE-polarized radiation. In this way, the amplification at the point where both amplification profiles cross each other, is near both peak values. At this point the optical amplifier of this example is nearly polarization insensitive and the amplification is obtained at a relatively low current due to the relatively large tensile and compressive stresses.

Figure 4:
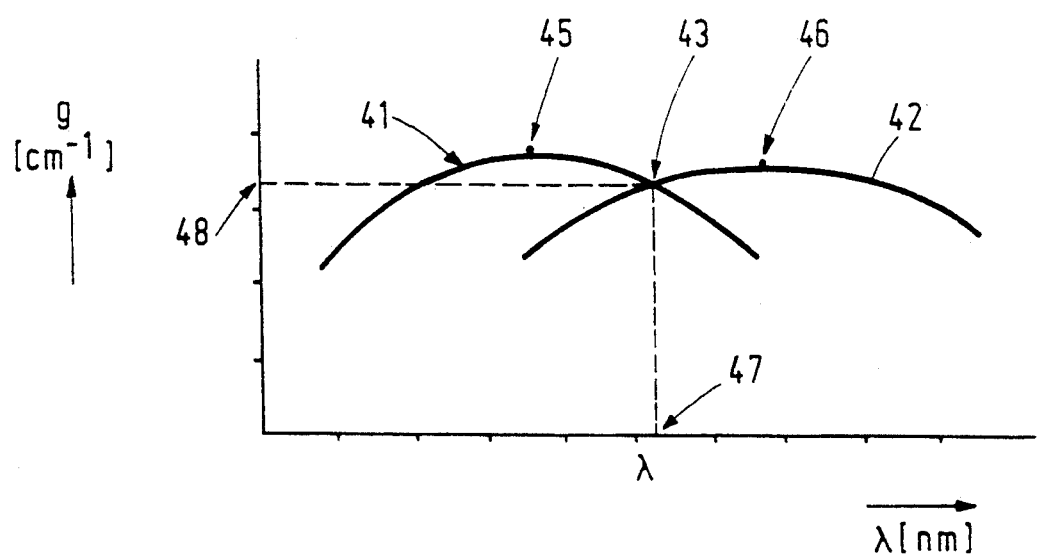

An active layer composed in this manner gives rise to an amplification (g) as a function of the wavelength (û) of the radiation (I) to be amplified as shown in FIG. 4. The amplification profile 41 shows the amplification for the TM-polarized portion of the radiation to be amplified. The amplification profile 42 does the same for the TE-polarized portion. Thanks to the presence of the tensile and compressive stresses of suitable value, both the TM and the TE-amplification profiles 41 and 42 are at substantially the same level in this embodiment of the amplifier. The amplification g is equal and relatively great for both modes for the wavelength belonging to point 42, i.e. substantially equal to the maximum amplification which is indicated with 45 for the TE-mode and with 46 for the TM-mode. Near the wavelength ($(\text{û})_0$, see point 47) belonging to point 43, this embodiment of the amplifier will be substantially independent of the polarization at a current strength (i) through the amplifier corresponding to an amplification 48 which current strength is, thanks to the relatively high tensile and compressive stress in the first and second portions, relatively low.

This embodiment of the optical amplifier has the DCPBH (=Double Channel Planar Buried Hetero) structure, which is widely used for optical communication. The invention, however, is by no means restricted to this structure.

The DCPBH structure of the optical amplifier of this example in addition comprises a current-limiting layer structure. This structure comprises two grooves 14 and 15 which bound the strip-shaped amplification region and in which a layer 11 of p-type InP with a thickness (outside the grooves) of approximately 0,3 μm and a doping concentration of approximately $2 \times 10^{18}$ at/cm$^3$, and a blocking layer 12 of n-type InP with a doping concentration of approximately $10^{18}$ at/cm$^3$ and a thickness of approximately 0,5 μm have been provided. The layers 11 and 12 do not extend on the strip-shaped portion of the layer 5 situated between the grooves 14 and 15, so that the p-type second passive layer 3, 6 directly adjoins the second separate cladding layer 5 in that portion. Furthermore, a silicon dioxide layer 10 is provided over the contact layer 13, in which silicon dioxide layer a slot-shaped opening is formed, within which an electrode layer 16 provided on the upper surface makes contact with the layer 13.

The manufacture of such a DCPBH structure is described in detail inter alia in the European Patent Application by Applicant published under no. EP 259919, so that it need not be described in any more detail here.

Figure 3:
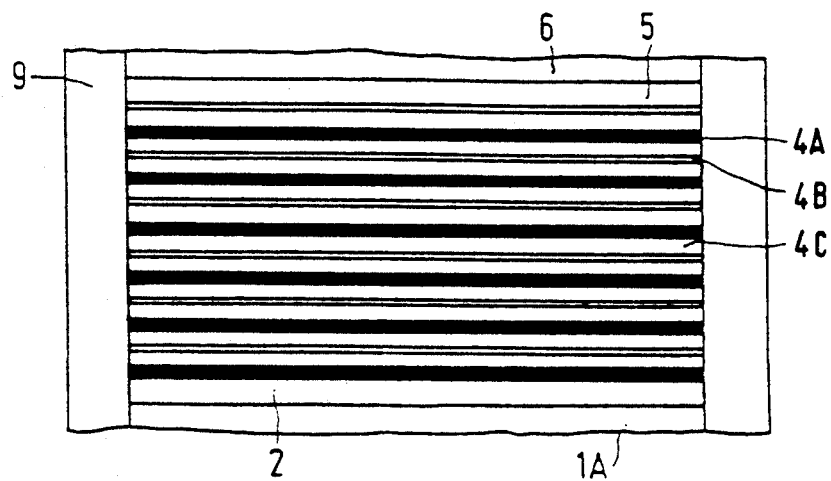
FIG. 3 shows a more detailed cross-section of the active layer of the device, FIG. 4 diagrammatically shows the amplification (g) as a function of the wavelength (û) of the radiation to be amplified (I) for the optical amplifier of FIG. 1 and FIG. 5, FIG. 5 diagrammatically shows a second embodiment of an optical amplifier according to the invention, partly in perspective and partly in cross-section, FIG. 6 diagrammatically shows a cross-section taken on the line VI—VI of FIG. 5.
Figure 5:
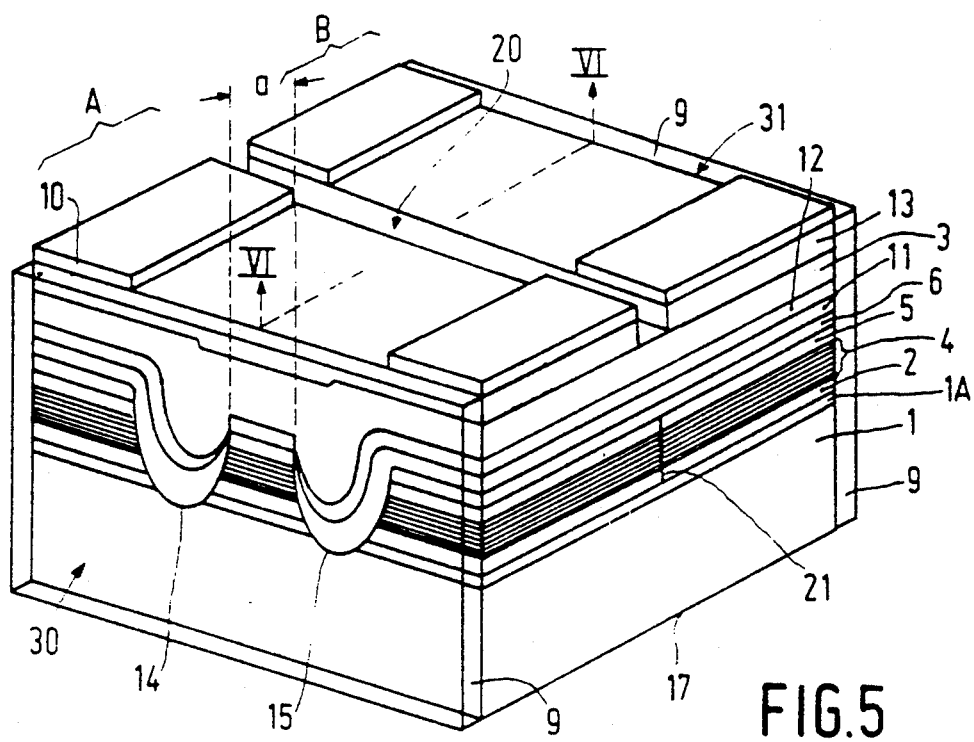
Figure 6:
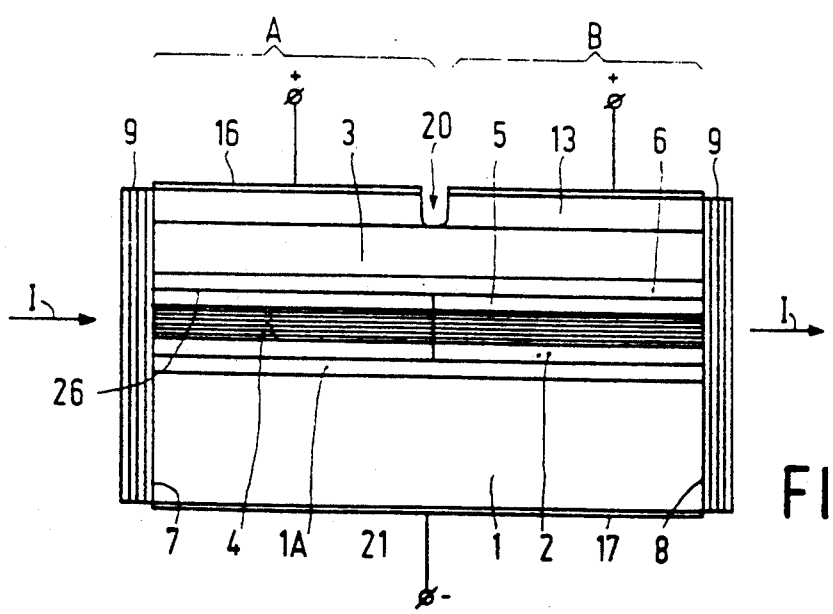
Figure 7:
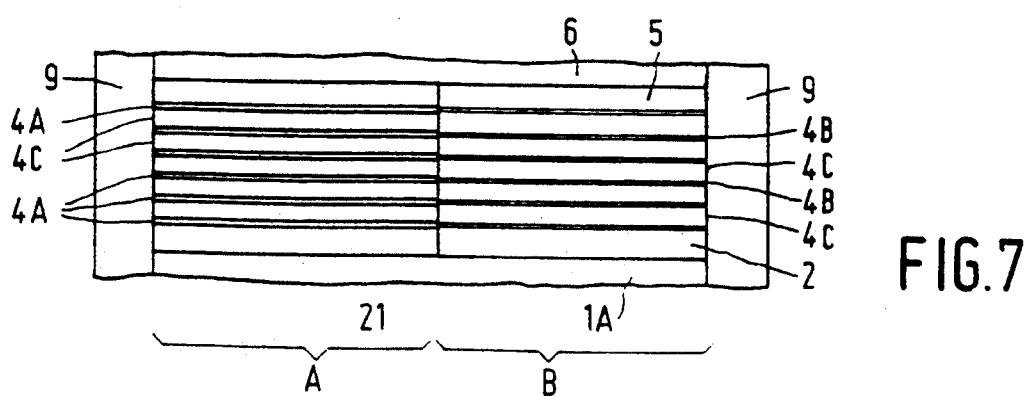
FIG. 7 shows a more detailed cross-section of the active layer of the device of FIG. 5, and FIGS. 8-10 show the optical amplifier of FIG. 5 in successive stages of manufacture.

FIG. 5 diagrammatically shows a second embodiment of an optical amplifier according to the invention partly in perspective and partly in cross-section, and FIG. 6 diagrammatically shows the optical amplifier of FIG. 5 in cross-section taken on the line VI—VI of FIG. 5. FIG. 7 shows in more detail the active layer 4 of the FIGS. 5 and 6. The device has a semiconductor body which corresponds largely to that of the optical amplifier according to an earlier embodiment. Corresponding parts have the same reference numerals and the description of the FIGS. 1 to 3 is referred to for a discussion thereof. The device here comprises two substantially equally large sections A and B (see FIGS. 5 to 7) corresponding with a first and second portion of the (QW and barrier) layers that form part of the active layer 4 and which adjoin one another at the interface 21. Above this interface 21 there is a groove 20 of approximately 20 μm thickness which extends from the surface through the metal layer 16, through the silicon dioxide layer 10 and through the contact layer 13 down to the second passive layer 3. The metal layer 16 split into two portions by the groove 20 comprises separate connection conductors for the sections A and B. Forward bias currents $i_A$ and $i_B$ may be passed through the portions of the pn-junction 26 situated within the sections through these separate connection conductors and the connection conductor 17 which is common to both sections A and B. The active layer 4 (see FIG. 7) comprises a first portion of 6 QW layers 4A in section A which QW layers 4A are mutually separated by five barrier layers 4C of $In_xGa_{1-x}As_yP_{1-y}$ (x=0,82 and y=0,40) of 10 nm thickness. The QW layers 4A of the first portion contain $In_xGa_{1-x}As$ (x=0,35) and have a thickness of approximately 10 nm, and are under tensile stress.

According to the invention, another, second, portion of the (QW and barrier) layers forming part of the active layer 4, in this example all QW layers 4B in section B, is under compressive stress. The layers 4B contain here InxGa1−xAs (x=0,70) and have a thickness of approximately 3 nm. They are also mutually separated by barrier layers 4C with the same composition and thickness as the barrier layers 4C in section A. Due to the presence of the second portion of QW layers 4B, that are under compressive stress, the polarization sensitivity of the amplifier according to the invention is reduced, while the current required to obtain amplification is reduced. The tensile and compressive stresses in the QW layers 4A and 4B are so high that the peak value of the amplification profile of the TM-polarized radiation is about equal to the peak value of the amplification profile of the TE-polarized radiation. At the intersect of both profiles the amplifier is nearly polarization insensitive and the amplification is relatively high. The high amplification is obtained at relatively low currents through both portions A and B, thank to the presence of relatively high tensile and compressive stresses which are present in the portions A and B respectively. In this example the first and second portions of the (QW and barrier) layers of the active layer 4, corresponding with the sections A and B, lie within portions of the amplification region which adjoin different end faces. This enables a separate adjustment of the amplification profiles in both portions by means of adjustment of the current through each portion. The difference in thickness between the QW layers in the two sections ensures that the maximum amplification takes place at about the same wavelength, in this example at approximately 1,5 μm.

An active layer 4 composed in such a way results in an amplification (g) as a function of the wavelength ( û ) of the radiation to be amplified (I), similar to the one shown in FIG. 4. We refer here to the description of FIG. 4. The only difference with a previous embodiment is that the level of the amplification profiles 41 and 42 now can be adjusted independently by adjusting the current through each of the sections A and B.

Figure 8:
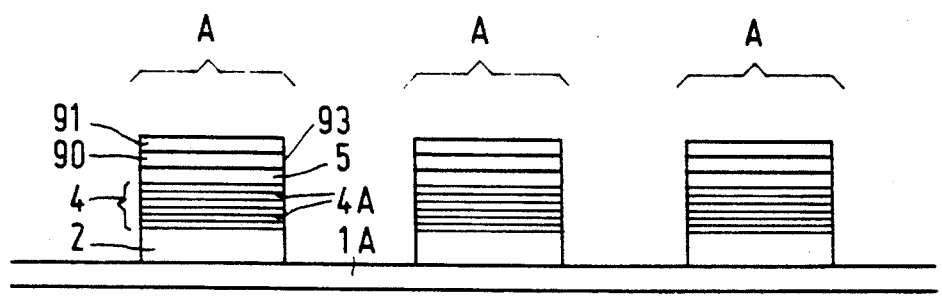
Figure 9:
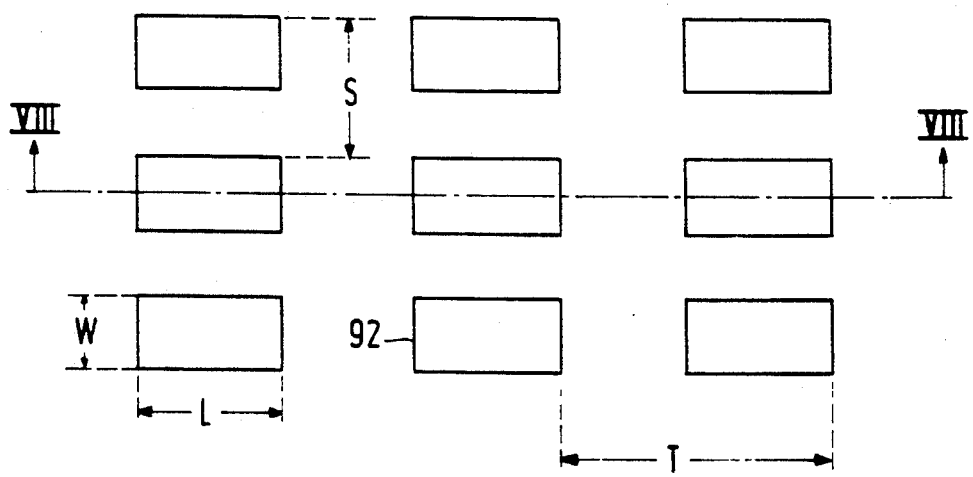
Figure 10:
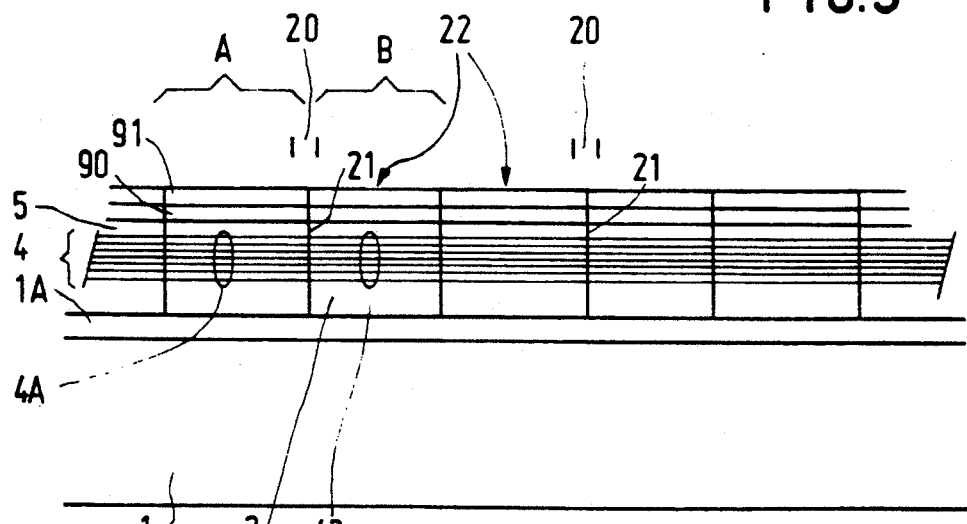

The manufacture of the optical amplifier, in as far as it deviates from that in an earlier example, will now be explained with reference to FIGS. 8–10, which show the optical amplifier of FIG. 5 in successive stages of manufacture. In a first growing process, for example by means of MOVPE (=Metal Organic Vapor Phase Epitaxy), the following are successively provided on an n-type substrate 1 of InP: a first passive layer 1A of n-type InP, a first separate cladding layer 2, an active layer 4, a second separate cladding layer 5, and a p-type layer 90 of InP and having a thickness of approximately 0,1 μm. The compositions and thicknesses of the active layer, separate cladding layers, and passive layers are as indicated above for section A. Then an approximately 0,1 μm thick layer 91 of silicon dioxide is provided on the semiconductor layer structure (see FIG. 8) by means of, for example, sputtering. A pattern of strip-shaped regions 92 is then formed in this layer 91 by photolithography. The width W of one strip-shaped region 92 is approximately 20 μm, its length L is approximately 500 μm. The pitch S of the pattern is 300

μm and the pitch T is 1000 μm (see FIG. 9). After this, mesas 93 are formed by etching (see FIG. 8), the interface between the first separate cladding layer 2 and the first passive layer 1A acting as an etching stopper in connection with the use of an etchant which contains $H_2SO_4$, $H_2O_2$ and $H_2O$, during etching of the first separate cladding layer 2. After this, a similar semiconductor layer structure as in the first growing process is provided in a second growing process, for example again by means of MOVPE, between and adjoining to the side walls of the mesas 93. The composition and thickness of the QW layers is now chosen as indicated above for the section B (see FIG. 10). After removal of the masks 92, a further p-type InP layer is grown on the p-type InP semiconductor layer 90 with the same doping concentration as the semiconductor layer 90 and a thickness of approximately 0,9 μm. Together with the semiconductor layer 90, this layer forms the semiconductor layer indicated with the reference numeral 6 in FIGS. 5 and 6, forming part of the second passive layer 3, 6. Subsequently, the semiconductor body of this embodiment of the amplifier is finished as in a previous embodiment. Reference is also made here to the Patent Application EP 259919 mentioned there. After the semiconductor body has been finished and the silicon dioxide layer 10 and the metal layers 16 and 17 have also been provided, an approximately 20 μm wide groove 20 is formed above the junction 21 between the sections A and B in the active layer 4 by means of photolithography and etching. This groove extends from the upper surface through the metal layer 16, the silicon dioxide layer 10 and the contact layer 13 down to the second passive layer 3. After cleaving in the spots indicated with 22 in FIG. 10 and after contacting of the connection conductors 16 and 17, this embodiment of the optical amplifier is ready for use (see FIG. 5).

The invention is not limited to the embodiments given, since many modifications and variations are possible for those skilled in the art within the scope of the invention. Thus other semiconductor materials or other compositions of the chosen semiconductor materials than those mentioned in the examples may be used.

Also, the conductivity types may all be (simultaneously) replaced by their opposites. Apart from the manufacturing methods given here, variants to these methods are also available to those skilled in the art, while also other techniques, for example for providing the semiconductor layers, may advantageously be used.

Furthermore, the invention is not limited to the amplifier structure of the DCPBH type described for the embodiments here. Other types, such as the BH (=Buried Hetero) type or the RW (=Ridge Waveguide) type may be used as well. In fact, many variations in the structure described here are available to those skilled in the art, all of which have the characteristic that the desired optical waveguiding and the supply of charge carriers to the region where the amplification takes place are effected.

Finally, it should be noted that the invention may also be used for optical amplifiers in which no electrical connection conductors are used for supplying the current, but in which one or several radiation beams are used. In that case a so-called optically pumped optical amplifier is obtained.

We claim:
1. An optical amplifier having at least a semiconductor body comprising a substrate of a first conductivity type and at least a semiconductor layer structure situated thereon and comprising at least a first passive layer of the first conductivity type, a second passive layer of the second, opposite conductivity type, and between the first and the second passive layer an active layer and a pn junction, amplification of electromagnet radiation within a wavelength range taking place at at least a selected current strength in the forward direction through the pn junction within a strip-shaped amplification region of the active layer, which has a greater effective refractive index and a smaller bandgap for the radiation to be amplified than the first and second passive layers, which comprises a plurality of quantum well layers of a semiconductor material having a direct band transition and being mutually separated by barrier layers of a different semiconductor material, and in which a first portion of the quantum well and barrier layers which form part of the active layer are under tensile stress, the strip-shaped amplification region being bounded in the longitudinal direction by end faces which serve as input and output surfaces for the radiation to be amplified and which are of low reflection, the second passive layer and the substrate being electrically connected to connection conductors, characterized in that a second portion of the quantum well and barrier layers which form part of the active layer are under compressive stress.

2. An optical amplifier as claimed in claim 1, characterized in that both the tensile and the compressive stress are so high that the peak value of the amplification profile of TM-polarized radiation is approximately equal to the peak value of the amplification profile of TE-polarized radiation.

3. An optical amplifier as claimed in claim 1, characterized in that the first portion contains quantum well layers which are under tensile stress and the second portion contains quantum well layers which are under a compressive stress.

4. An optical amplifier as claimed in claim 1, characterized in that the quantum well layers within the first portion of the amplification region comprise a semiconductor material which has a lattice constant which is smaller than that of the substrate, and that the quantum well layers within second portion comprise a semiconductor material which has a lattice constant which is larger than that of the substrate.

5. An optical amplifier as claimed in claim 1, characterized in that both portions of the quantum well and barrier layers forming part of the active layer comprise within the active region of the amplification region a single stack of layers which are alternately under tensile stress and under compressive stress.

6. An optical amplifier as claimed in claim 1, characterized in that both portions of the quantum well and barrier layers forming part of the active layer lie within portions of the amplification region which adjoin different end faces.

7. An optical as claimed in claim 5, characterized in that the substrate and the passive layers comprise InP, the barrier layers and the separate cladding layers comprise InGaAs compatible therewith, and the quantum well layers comprise InGaAs which contains within the first portion of the amplification region approximately 35 at % indium and within the second portion of the amplification region approximately 70 at % indium, while the thickness of the quantum well layers within the first portion is approximately 10 nm and within the second portion approximately 3 nm.

8. An optical amplifier as claimed in claim 1, characterized in that the thickness of the layers forming part of the active layer and the extent of the stress present therein are so chosen that at least substantially no relaxation of this stress occurs.

9. An optical amplifier as claimed in claim 6, characterized in that the substrate and the passive layers comprise InP, the barrier layers and the separate cladding layers comprise InGaAs compatible therewith, and the quantum well layers comprise InGa which contains within the first portion of the amplification regions approximately 35 at % indium, while the thickness of the quantum well layers within the first portion is approximately 10 nm and within the second portion approximately 3 nm.

* * * * *